(12) United States Patent
Okada et al.

(10) Patent No.: US 7,331,502 B2
(45) Date of Patent: Feb. 19, 2008

(54) METHOD OF MANUFACTURING ELECTRONIC PART AND ELECTRONIC PART OBTAINED BY THE METHOD

(75) Inventors: Ryoichi Okada, Utsunomiya (JP);
Hitoshi Aoki, Utsunomiya (JP);
Yoshitaka Okugawa, Utsunomiya (JP);
Kensuke Nakamura, Utsunomiya (JP);
Shinichiro Itoh, Utsunomiya (JP)

(73) Assignee: Sumitomo Bakelite Company, Ltd. (JP)

( * ) Notice: Subject to any disclaimer, the term of this patent is extended or adjusted under 35 U.S.C. 154(b) by 268 days.

(21) Appl. No.: 10/472,311

(22) PCT Filed: Mar. 19, 2001

(86) PCT No.: PCT/JP02/02626
§ 371 (c)(1),
(2), (4) Date: Sep. 18, 2003

(87) PCT Pub. No.: WO02/076161
PCT Pub. Date: Sep. 26, 2002

(65) Prior Publication Data
US 2004/0105223 A1 Jun. 3, 2004

(30) Foreign Application Priority Data
Mar. 19, 2001 (JP) ............................. 2001-079329
Dec. 18, 2001 (JP) ............................. 2001-384834

(51) Int. Cl.
*B23K 31/02* (2006.01)
(52) U.S. Cl. .................. 228/180.22; 228/245; 228/254
(58) Field of Classification Search ................ 228/245, 228/254, 123
See application file for complete search history.

(56) References Cited

U.S. PATENT DOCUMENTS 3,764,436 A * 10/1973 Schmidt et al. ............. 156/288

(Continued)

FOREIGN PATENT DOCUMENTS

EP 0607534 A2 7/1994

(Continued)

OTHER PUBLICATIONS

Okugawa, Translation to JP 10-270497, Sep. 10, 1998, 7 pages.*

(Continued)

*Primary Examiner*—Kiley Stoner
(74) *Attorney, Agent, or Firm*—Smith, Gambrell & Russell, LLP

(57) ABSTRACT

In a process for producing an electronic part which comprises soldering (A) an electronic member having conductor portions I for electric connection having a solder layer or a solder bump (a solder portion) on a surface of a tip and (B) an electronic member to be connected having conductor portions II for electric connection arranged at positions corresponding to positions of conductor portions I by pressing (A) to (B) under heating via an adhesive layer, the solder portion is brought into contact with the adhesive layer, the solder portion is melted by heating at a temperature of or higher than a melting point of the solder, the soldering is conducted by pressing the melted solder portion, and the adhesive layer is cured. An electronic part is obtained in accordance with the process. Electric connection is surely achieved and a highly reliable electronic part can be obtained with excellent productivity.

45 Claims, 6 Drawing Sheets

U.S. PATENT DOCUMENTS

| | | | |
|---|---|---|---|
| 5,128,746 A * | 7/1992 | Pennisi et al. | 257/738 |
| 5,401,913 A | 3/1995 | Gerber | |
| 5,975,408 A | 11/1999 | Goossen | |
| 6,578,755 B1 * | 6/2003 | Elenius et al. | 228/254 |

FOREIGN PATENT DOCUMENTS

| | | | |
|---|---|---|---|
| EP | 1009205 A1 | 6/2000 | |
| JP | 05 090763 A | 4/1993 | |
| JP | 5-198946 A | 8/1993 | |
| JP | 8-195560 A | 7/1996 | |
| JP | 9-23067 A | 1/1997 | |
| JP | 10-270497 | * 10/1998 | |
| JP | 11150152 | 6/1999 | |
| JP | 2002-111216 A | 4/2002 | |
| JP | 2002-158447 A | 5/2002 | |

OTHER PUBLICATIONS

International Search Report, dated Jun. 18, 2002, issued by the Japanese Patent Office, for PCT Patent Application No. PCT/JP02/02626 (2 pages).

* cited by examiner

Figure 1
Figure 1(a)
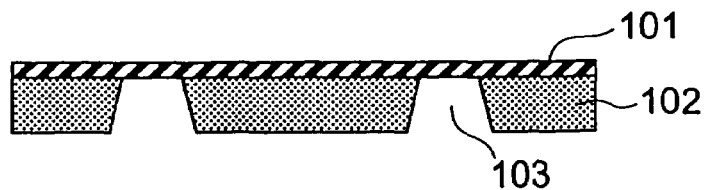
Figure 1(b)
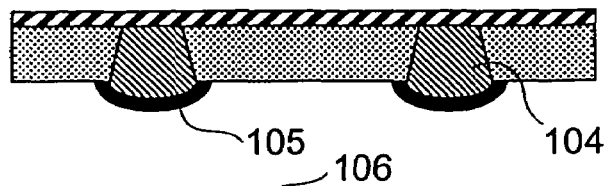
Figure 1(c)
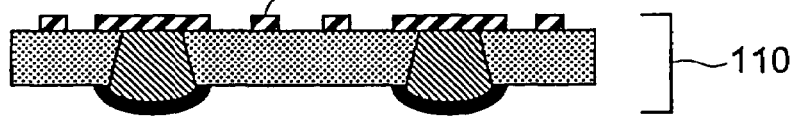
Figure 1(d)
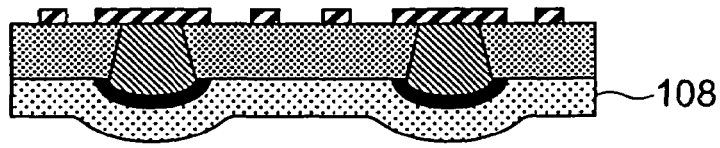
Figure 1(e)
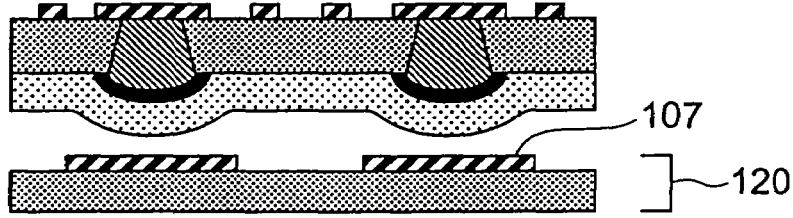
Figure 1(f)
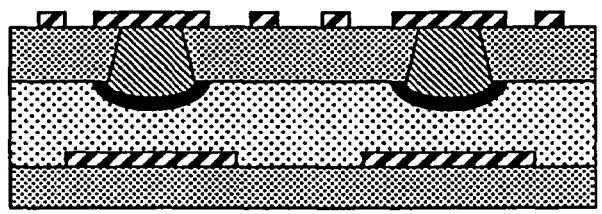
Figure 1(g)
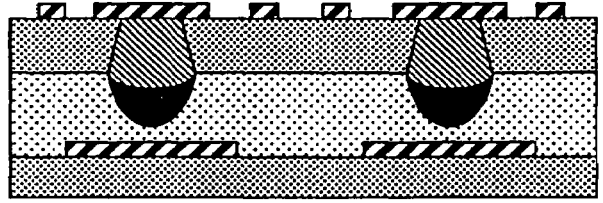
Figure 1(h)
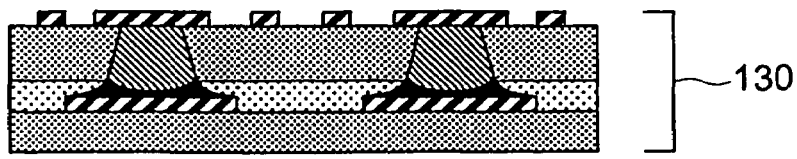

Figure 2

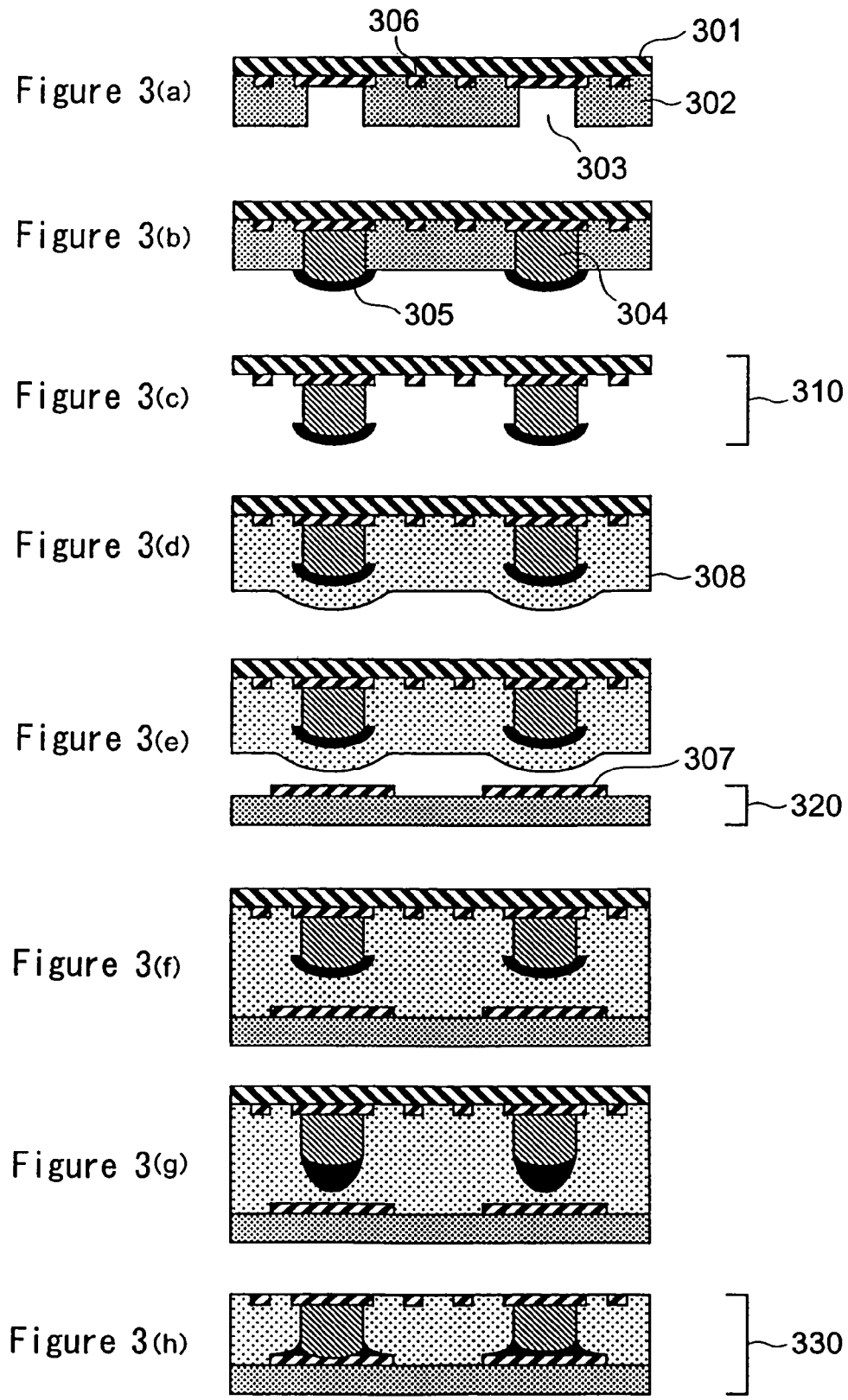

Figure 4
Figure 4(a)
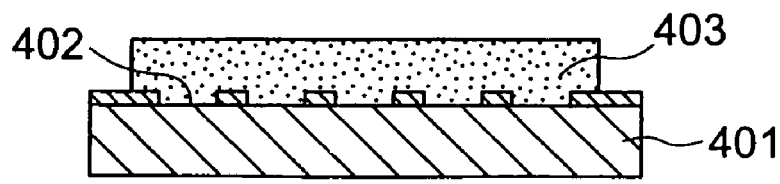
Figure 4(b)
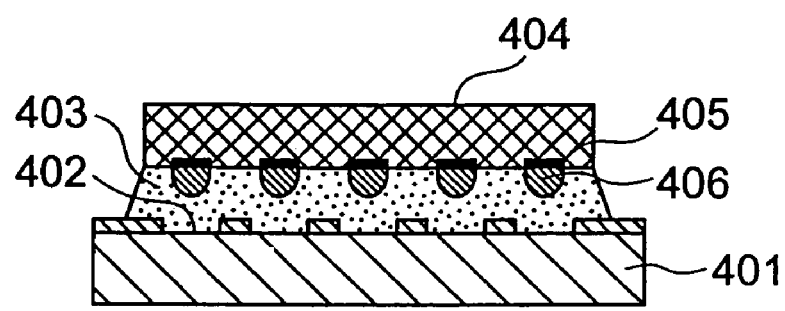
Figure 4(c)
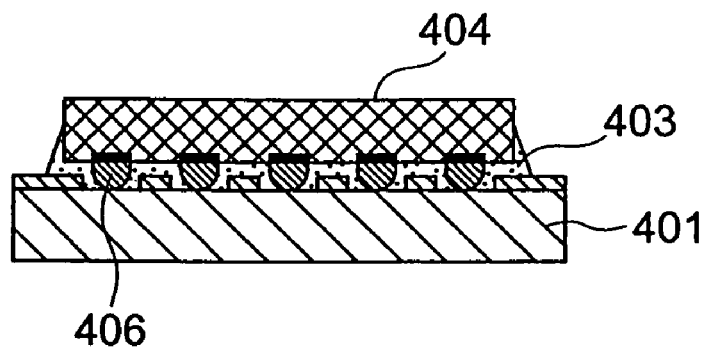
Figure 4(d)
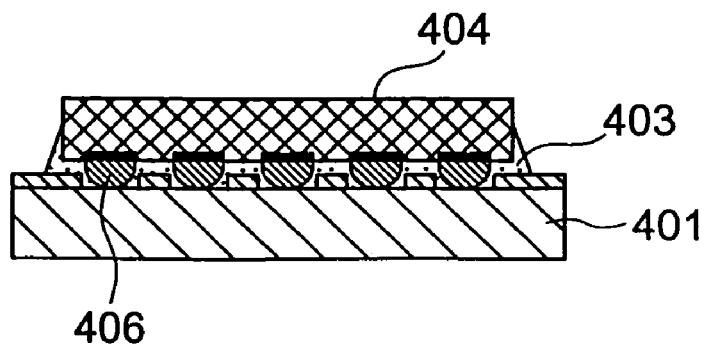

CONDITION① (EXAMPLE 1)   CONDITION② (COMPARATIVE EXAMPLE 1)

CONDITIONS OF HEATING AND DEGREE OF APPLIED PRESSURE

CONDITION① (EXAMPLE 1)   CONDITION② (COMPARATIVE EXAMPLE 1)

CONDITION OF SOLDERING

Figure 7
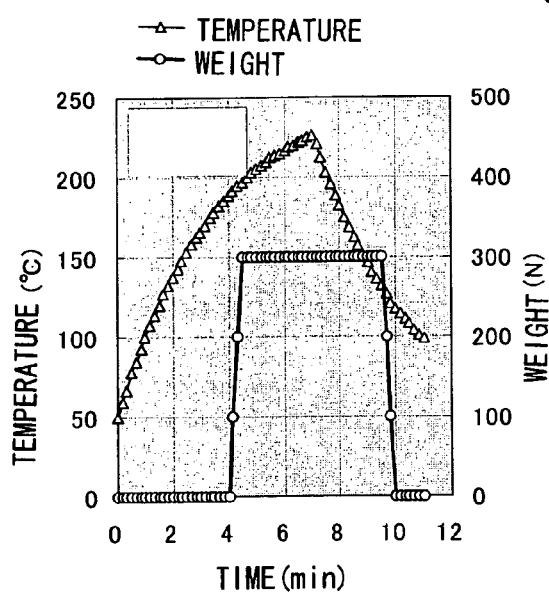
CONDITION③ (EXAMPLE 2)
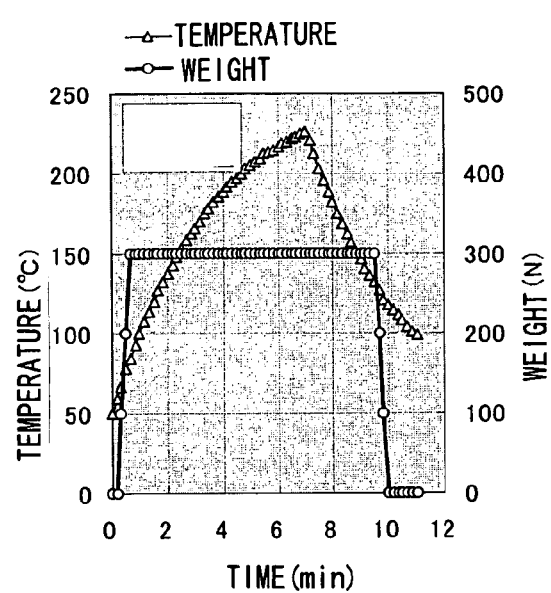
CONDITION④ (COMPARATIVE EXAMPLE 2)
CONDITIONS OF HEATING AND DEGREE OF APPLIED PRESSURE

METHOD OF MANUFACTURING ELECTRONIC PART AND ELECTRONIC PART OBTAINED BY THE METHOD

TECHNICAL FIELD

The present invention relates to a process for producing an electronic part and an electronic part obtained in accordance with the process. More particularly, the present invention relates to a process for producing a highly reliable multi-layer wiring board in which the connection between layers is surely achieved with excellent productivity by efficiently conducting electric connection and bonding of layers simultaneously, a process for producing a highly reliable semiconductor device with excellent productivity by effectively mounting preferably a semiconductor flip chip to a wiring substrate in accordance with the non-flow underfill process, and a multi-layer wiring board and a semiconductor device obtained in accordance with the processes.

BACKGROUND ART

As the electronic instruments recently exhibit higher functions and have lighter weights and smaller sizes, electronic members are integrated with a higher density and mounted in the instruments with a higher density. Semiconductor packages become smaller and have a greater number of pins.

As the conventional circuit substrates which are called printed wiring boards, wiring substrates prepared as described in the following are mainly used. A copper foil attached to a glass epoxy board which is a laminate obtained by impregnating a woven fabric of a glass fiber with an epoxy resin is patterned; a plurality of such laminates are laminated; holes penetrating the obtained laminate are formed by a drill and vias are formed by plating the wall surface of the holes; and layers are electrically connected with each other through the vias. However, since parts mounted to the wiring substrates become smaller and are placed more densely, problems arise on the mounting on the above wiring substrates due to insufficient density of the wiring.

Under the above circumstances, built-up multi-layer wiring boards are used recently. The built-up multi-layer wiring is formed by laminating a plurality of insulation layers constituted with a resin alone and a plurality of layers of a conductor. As the process for forming a via, various processes such as the laser process, the plasma process and the photo process are used in place of the drilling which has heretofore been used. Vias having a small diameter are arranged and a great density can be achieved. As the portion for connecting layers, a blind via and a buried via (a via filled with a conductive material) are used. The buried via is attracting attention since a stacked via in which a via is formed on top of another via can be formed. The process for forming the buried via includes a process of filling the via hole by plating and a process of filling the via hole with a conductive paste.

In Japanese Patent Application Laid-Open No. Heisei 11(1999)-204939, a multi-layer circuit substrate is disclosed. The multi-layer circuit substrate has a construction such that an insulation sheet has a wiring pattern disposed at least on one face and conductive via holes which penetrate the insulation sheet from the front face to the back face, a circuit substrate has electrodes for connection which are disposed at desired positions on the front face and the back face and electrically connected with the via hole, and a plurality of the insulation sheets and a plurality of the circuit substrates are alternately laminated. The insulation layer is constituted with a cured layer of a thermosetting adhesive which has a viscosity decreasing to 100 Pa·s or smaller by heating at a temperature in the range of 100 to 300° C. and is cured to at least 70 to 80% by being left standing at a temperature in the above range. The density of the portion for connecting layers can be increased by using the above multi-layer circuit substrate. For forming the electrode for connection, it is attempted that electric connection is formed by using a conductive adhesive or an alloy containing Sn as the main component such as Sn—Pb solder at a temperature of 300° C. or lower. It is also attempted that Au and Sn is formed on the surface of the electrode for connection and electrical connection is formed with an Au—Sn alloy. However, the conductive adhesive has a problem in that reliability of the connection is poor and the connection with the alloy containing Sn as the main component has a problem in that the wetting between the metals is poor since the surface of Sn is not cleaned and the connection is not sufficiently formed.

In Japanese Patent Application Laid-Open No. Heisei 8(1996)-195560, as the process for producing a circuit substrate which can be used for decreasing the size and the thickness of the substrate and for decreasing the area of the portion for electric connection of the conductor layer, a process for producing a printed circuit substrate which comprises molding under a pressure laminates formed by stacking a prescribed number of layers of an insulating material having a layer of a conductor circuit on one or both faces and layers of an insulating material having no layers of a conductor circuit and, at the same time, electrically connecting at least prescribed two stacked layers of a conductor circuit with each other, is described. In the above process, the layers of an insulating material are all formed as layers of an insulating material having a sheet form and not containing glass fiber, a protrusion (a block of a metal) composed of a conductor for electrically connecting layers of a conductor circuit is disposed at a prescribed position on the layer of a conductor circuit, and the protrusion breaks and penetrates the resin layer of an insulating material by the force of pressing the laminate using a press jig plate so that the protrusion is brought into contact with and attached to the faced circuit layer of a conductive material under a pressure. It is also described that, in the above process, a solder layer having a melting point higher than the temperature of curing the resin in the resin layer for insulation is disposed at the tip of the protrusion, the solder layer is brought into contact with the layer of a conductor circuit by breaking and penetrating the resin layer for insulation by pressing under heating, the solder layer is thereafter melted by elevating the temperature to the melting point of the solder in this condition so that the protrusion is connected with the layer of a conductor circuit, and the solder layer is then cooled and solidified. In accordance with this process, a stacked via in which a via is formed on top of another via can be formed and the density of the portion for connecting layers can be increased since the connection of the layers is conducted through the protrusion (a block of a metal) composed of the conductor. However, in the former process, the electrical connection is made through the physical contact alone and reliability is considered to be poor. In the latter process, the solder cannot spread by wetting and the soldering becomes impossible unless the surface of the solder layer at the tip of the protrusion and the surface of the layer of a conductor circuit are sufficiently cleaned.

The present inventors have heretofore examined the process for connecting layers in a multi-layer wiring board and proposed a process in which a conductor post is formed on any of lands disposed in a wiring pattern having a land for connecting layers and in a member to be connected having a land for connecting layers for connection with the wiring pattern, a solder layer is formed at least on the surface of the conductor post or on the land faced to the conductor post, the conductor post and the land faced to the conductor post are tightly attached and pressed together via an adhesive layer, and then the attached portions are heated at the melting point of the solder to achieve the connection between layers. However, when the solder is pressed before the solder is melted, the solder is deformed by the contact with the metal land for connecting layers and the tip is flattened. In this condition, a thin adhesive layer is present between the layers. Although the adhesive layer has the function of cleaning the surface necessary for soldering, the function of cleaning the surface is not sufficiently exhibited since the absolute amount of the adhesive layer is small. Therefore, a problem arises in that the excellent soldering is not achieved. In the portion of the solder layer which is not flattened, the function of cleaning the surface is sufficiently exhibited since the adhesive layer is sufficiently present in the vinicity. Therefore, excellent soldering can be exhibited between the solder and the land for connecting layers when the solder is melted. In other words, the soldering is achieved while the resin remains in some portions. This condition is not considered to provide an excellent soldered portion.

Therefore, in a multi-layer wiring board on which a semiconductor chip is mounted, it has been desired that a technology for surely achieving the connection of layers and producing a highly reliable multi-layer wiring board with excellent productivity is developed.

On the other hand, in the field of mounting a semiconductor chip, semiconductor devices using the flip chip connection have been attracting attention due to the excellent electric properties and are already produced in a great amount.

In the process of flip chip connection, heretofore, electrode terminals in a semiconductor chip and connecting pads of a substrate are first connected by using conductive bumps, a liquid resin is then cast into a gap between the semiconductor chip and the substrate (the underfill step), and the resin is cured by heating. However, in accordance with this process, the heating step is necessary for each of the connection of the terminals and the curing of the resin and the cost inevitably increases. Moreover, it takes time for casting the resin since the gap between the chip and the substrate is very narrow.

To overcome the above problems, various processes for the single-step connection in which the connection and the casting of the resin are conducted simultaneously have been studied. As one of such processes under the study, a process in which a chip or a substrate is coated with a resin containing a component for activating the surface of a metal, the chip is placed on the substrate, and the connection of the terminals and the underfill are simultaneously achieved by heating the resultant combination without further treatments, which is the so-called non-flow underfill process, has been studied. Since the step of connection and the step of casting the resin can be conducted in a single step by using the non-flow underfill process, the investment on apparatuses and the cost of operation can be decreased due to the remarkable simplification of the production steps. Moreover, the through put can be increased since the step of casting the resin into a narrow gap which takes a great time can be omitted. In this process, when the conductive bump is a solder bump, the solder bump is melted by heating and connected to another terminal or a pad. By continuing the heating in the same condition, the curing reaction of the resin proceeds and the entire face of the bonding can be fixed.

In the semiconductor device obtained by mounting a semiconductor flip chip to a wiring substrate in accordance with the non-flow underfill process, it is desired that technology for surely achieving the electric connection and producing a highly reliable semiconductor device with excellent productivity is developed similarly to the technology for the multi-layer wiring board.

DISCLOSURE OF THE INVENTION

Under the above circumstances, the present invention has a first object of providing a process for producing a highly reliable multi-layer wiring board in which the electric connection is surely achieved with excellent productivity. Specifically, the present invention has the first object of providing a process for producing a highly reliable multi-layer wiring board in which the connection between layers is surely achieved with excellent productivity by efficiently conducting electric connection and bonding of layers simultaneously and a process for producing a highly reliable semiconductor device with excellent productivity by effectively mounting preferably a semiconductor flip chip to a wiring substrate in accordance with the non-flow underfill process. The present invention has a second object of providing an electronic part obtained in accordance with the above process.

As the result of intensive studies by the present inventors to achieve the above objects, it was found that, in a process for producing an electronic part which comprised soldering an electronic member having conductor portions for electric connection I having a solder layer or a solder bump on a surface of a tip and an electronic member to be connected having conductor portions for electric connection II by pressing the members under heating via an adhesive layer, the above objects could be achieved by bringing at least the solder layer or the solder bump into contact with the adhesive layer, melting the solder layer or the solder bump by heating at a temperature of or higher than a melting point of a solder forming the solder layer or the solder bump, applying a pressure so that the apex portion of the solder layer or the solder bump in the melted condition is brought into point contact with the portion for electric connection II, achieving soldering by spreading the solder from the point of contact by wetting in concentric circular shapes, and curing the adhesive layer. The present invention has been completed based on the knowledge.

The present invention provides:
(1) A process for producing an electronic part which comprises soldering (A) an electronic member having conductor portions I for electric connection having a solder layer or a solder bump on a surface of a tip and (B) an electronic member to be connected having conductor portions II for electric connection arranged at positions corresponding to positions of conductor portions I for electric connection by pressing electronic member (A) to electronic member (B) under heating via an adhesive layer, the process comprising bringing at least the solder layer or the solder bump into contact with the adhesive layer, melting the solder layer or the solder bump by heating at a temperature of or higher than a melting point of a solder forming the solder layer or the solder bump, conducting the soldering by pressing the melted solder layer or the solder bump, and curing the adhesive layer; and (2) an electric part obtained in accordance with the above process.

BRIEF DESCRIPTION OF THE DRAWINGS

FIG. 1 shows a diagram exhibiting the first embodiment of the process for producing the multi-layer wiring board as the first aspect of the present invention.

FIG. 3 shows a diagram exhibiting the third embodiment of the process for producing the multi-layer wiring board as the first aspect of the present invention.

FIG. 4 shows a diagram exhibiting an embodiment of a process for producing a semiconductor device the second aspect of the present invention.

FIG. 7 shows a diagram exhibiting the condition of heating under a pressure in Example 2 and Comparative Example 2.

Figure 2A:
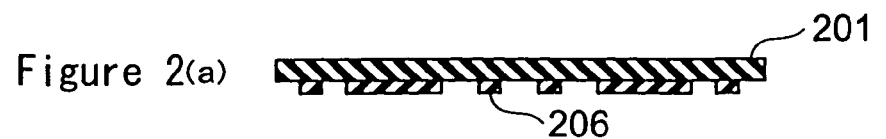
FIG. 2 shows a diagram exhibiting the second embodiment of the process for producing the multi-layer wiring board as the first aspect of the present invention.

In the FIGS., 101 means a metal foil, 201 and 301 mean metal plates, 102 and 202 mean insulation films, 302 means a plating resist, 104 and 203 mean vias, 303 means an opening, 104, 204 and 304 mean conductor posts, 105, 205 and 305 mean solder layers. 106, 206 and 306 mean wiring patterns, 107, 207 and 307 mean lands for connecting layers, 108, 208 and 308 mean adhesive layers, 110, 210 and 310 mean connecting layers, 120, 220 and 320 mean layers to be connected, 130, 230 and 330 mean multi-layer wiring boards, 401 means a wiring substrate, 402 means terminal II, 403 means a resin layer for the non-flow underfill, 404 means a semiconductor element, 405 means terminal I, and 406 means a solder bump.

THE MOST PREFERRED EMBODIMENT TO CARRY OUT THE INVENTION

The process for producing an electronic part of the present invention comprises soldering (A) an electronic member having conductor portions I for electric connection having a solder layer or a solder bump on a surface of a tip and (B) an electronic member to be connected having conductor portions II for electric connection arranged at positions corresponding to positions of conductor portions I for electric connection by pressing electronic member (A) to electronic member (B) under heating via an adhesive layer, the process comprising bringing at least the solder layer or the solder bump into contact with the adhesive layer, melting the solder layer or the solder bump by heating at a temperature of or higher than a melting point of a solder forming the solder layer or the solder bump, conducting the soldering by pressing the melted solder layer or the solder bump, and curing the adhesive layer.

The process for producing an electronic part of the present invention has two aspects as described in the following.

As the first aspect, the process provides a process for producing a multi-layer wiring board, wherein the electronic part is a multi-layer wiring board, electronic member (A) is a connecting layer which has a wiring pattern, conductor posts formed on the wiring pattern and solder layers formed on a surface of a tip of the conductor posts, and electronic member (B) is a layer to be connected which has lands for connecting layers used for connection with the conductor posts. As the second aspect, the process provides a process for producing a semiconductor device, wherein the electronic part is a semiconductor device, electronic member (A) is a semiconductor element which has terminals I for connection with outside disposed on a main face and solder bumps formed on a tip of a surface of terminals I, and electronic member (B) is a wiring board which has on a surface terminals II for connection with outside arranged at positions corresponding to positions of terminals I.

The process for producing a multi-layer wiring board as the first aspect will be described in the following with reference to Figures.

FIG. 1 shows a diagram exhibiting the first embodiment of the process for producing the multi-layer wiring board as the first aspect of the present invention. FIG. 1(h) shows a sectional view exhibiting the structure of the obtained multi-layer wiring board.

In the process for producing a wiring board of the present invention, a material having a two-layer structure composed of a metal foil 101 and an insulation film 102 is prepared and vias 103 are formed in the insulation film 102 (FIG. 1(a)). The material having a two-layer structure can be obtained by coating the metal foil 101 directly with a resin varnish in accordance with a process such as the printing, the curtain coating and the bar coating. Other materials having a two-layer structure such as commercial copper foils having a resin (for example, a copper foil having a polyimide) may be used. The material having a two-layer structure can also be obtained by entirely etching one of copper foils coating both faces of a glass epoxy laminate.

The process for forming the via 103 is not particularly limited as long as the process is suitable for the process of the present aspect. Examples of the process for forming the vias include the dry etching using laser or plasma and the chemical etching. As the laser, the carbon dioxide gas laser, the ultraviolet light laser or the excimer laser can be used. When the insulation film 102 contains a reinforcing fiber such as glass fiber, it is preferable that the carbon dioxide gas laser which can penetrate the glass cloth and form the via 103 is used. When the insulation film 102 does not contain a reinforcing fiber such as a polyimide, it is preferable that ultraviolet light laser which can form a finer via 103 is used. When the insulation film 102 is a photosensitive resin, the via 103 may be formed by selectively exposing the insulation film 103 to light, followed by development.

Using the metal foil 101 as the lead for electrolysis (the electrode for supplying electricity), conductor posts 104 are formed in the vias 103 in accordance with the electrolytic plating and, then, solder layers 105 are formed on the surface of the tip of the conductor posts 104 (FIG. 1(b)). By forming the conductor post 104 in accordance with the electrolytic plating, the shape of the tip of the conductor post can be controlled as desired. It is preferable that the conductor post has the surface placed on or protruding from the surface plane of the insulation film. By forming the conductor post protruding from the surface plane of the insulation film, a soldering having a reinforced structure formed by melting of the solder at the tip of the conductor post can be obtained.

The material of the conductor post 104 is not particularly limited as long as the material is suitable for the process of the present aspect. Examples of the material include copper, nickel, gold, tin, silver and palladium. By using copper, a stable conductor post 104 having a small resistance can be obtained.

As for the process for forming the solder layer 105, the solder layer 105 may be formed in accordance with the non-electrolytic plating, the electrolytic plating using the metal foil 101 as the lead for electrolytic plating (the electrode for supplying electricity) or the process of printing a paste containing a solder. In the process of printing, a mask for the printing must be positioned accurately relative to the conductor post 104. In the non-electrolytic plating or electrolytic plating, the process can be used for forming the conductor post more finely and densely since the solder layer 105 is not formed on portions other than the tip of the conductor post 104. In particular, the electrolytic plating is preferable since various types of the metal can be used for the plating and the control of the chemicals is easier in the electrolytic plating than in the non-electrolytic plating. The thickness of the solder layer is not particularly limited as long as the amount of the solder necessary for forming a convex shape and preferably the shape of a dome or a liquid droplet is provided when the solder is melted by heating.

As for the material of the solder layer 104, solders comprising Sn, In or at least two metals selected from Sn, Ag, Cu, Zn, Bi, Pd, Sb, Pb, In and Au are preferable and Pb-free solders which do not adversely affect the environment are more preferable.

A wiring pattern 106 is formed by selectively etching the metal foil 101 and a connecting layer 110 is obtained (FIG. 1(*c*)). Then, an adhesive layer 108 is formed on the surface of the insulation film 102 (FIG. 1(*d*)). The adhesive layer 108 can be formed in accordance with a process suitable for the resin. Examples of the process include direct application of a resin varnish in accordance with the printing, the curtain coating or the bar coating or lamination of a resin of the dry film type in accordance with the vacuum lamination or the vacuum pressing. It is preferable that the adhesive layer 108 has two functions, which are the function of cleaning the surface of the metal and the function of adhesion. The function of cleaning the surface of the metal is important for achieving the soldering and the function of adhesion is important for bonding of the connecting layer 110 and the layer to be connected 120. As for the thickness of the adhesive layer 108, it is preferable that, when the solder is melted by heating into a convex shape, at least the apex portion of the convex portion and the land for connecting layers faced to the convex portion are kept without contacting each other. When the adhesive layer has a thickness such that the convex portion and the land are not kept without contacting each other, there is the possibility that the solder layer contacts the land for connecting layers via the adhesive layer during the formation of the convex shape by melting of the solder and excellent soldering cannot be achieved. Although the adhesive layer 108 is formed on the surface of the insulation film 102 in FIG. 1(*d*), it is sufficient that at least the solder layer contacts the adhesive layer. When the solder contacts the adhesive layer, the solder is melted at the inside of the adhesive layer during the melting by heating and the convex shape can be formed. The adhesive layer 108 may be formed on the surface of the layer to be connected 120. Of course, the adhesive layers 108 may be formed on both of the insulation film 102 and the layer to be connected 120.

The connecting layer 110 is positioned relative to the layer to be connected 120 (FIG. 1(*e*)). For the positioning, positioning marks formed in the connecting layer and the layer to be connected in advance may be read by an image recognition apparatus or pins for positioning may be used.

The connecting layer 110 and the layer to be connected 120 are brought into contact with each other via the adhesive layer 108 (FIG. 1(*f*)). As the process for bringing the layers into contact with each other, for example, the adhesive layer 108 may be softened by heating under a pressure using a vacuum press or a vacuum laminator of the pressure type. In the above operation, it is advantageous that at least the solder layer and the land for connecting layers do not contact the air or contact the adhesive layer. It is also advantageous that the solder layer 105 and the land for connecting layers 107 are kept without contacting each other.

After the connecting layer 110 and the layer to be connected 120 are heated to a temperature of or higher than the melting point of the solder forming the solder layer 105 and the solder is melted, the layers are pressed together under a pressure (FIGS. 1(*f*) to 1(*h*)). In the step of heating under a pressure, when the solder layer 105 is heated at a temperature of or higher than the melting point of the solder using, for example, a vacuum press, the oxide film on the surface of the solder layer 105 is reduced and melted by using an adhesive preferably having the function of cleaning the surface for the adhesive layer 108 and a convex shape is formed due to the surface tension of the melted solder (FIG. 1(*g*)). It is preferable that the convex shape has the most stable shape of a dome or a liquid droplet. Then, the apex portion of the solder layer 105 in the convex shape and the land for connecting layers 107 are brought into the point contact with each other under a pressure and the soldering is achieved by concentric circular spreading of the solder by wetting from the position of the point contact. The viscosity of the adhesive layer 108 decreases by the heating at a temperature of or higher than the melting point of the solder. By melting the solder at the inside of the softening adhesive layer, a more convex shape is formed and the soldering is facilitated. It is preferable that the viscosity at this time is 50 Pa·a or smaller. When the viscosity is greater than 50 Pa·a, the formation of the convex shape in the solder layer 105, the contact between the solder layer and the land for connecting layers 107 and the spreading of the solder by wetting are adversely affected and there is the possibility that the soldering is not sufficiently achieved. The connecting layer 110 and the layer to be connected 120 are bonded together by curing the adhesive layer 108 by heating.

In general, in the solder layer 105 obtained in accordance with the electrolytic plating or the non-electrolytic plating, the metals constituting the solder remain in the condition just after being separated as crystals. To make the metals work effectively as the solder, the solder layer 105 may be coated with a flux and the solder may be subjected to the reflow. After the solder layer 105 is subjected to the reflow, it is preferable that the connecting layer 110 and the layer to be connected 120 are pressed under heating. However, this process is not advantageous since steps of the reflow and cleaning the flux must be added and there is the possibility that the cleaning of the flux is insufficient (the residual flux). In the present invention, since an adhesive having the function of cleaning the surface necessary for melting the solder of the solder layer 105 is used for the adhesive layer 108, the solder of the solder layer 105 can be melted in the step of heating and no step of cleaning is necessary.

When the pressure is applied before the solder of the solder layer 105 is melted in the adhesion under a pressure, the solder layer is deformed by the contact with the land for connecting layers 107. This causes a flat shape of the tip and the presence of the adhesive layer 108 as a thin film between the solder layer 105 and the land for connecting layers 107. Since the solder of the solder layer 105 has the function of cleaning the surface necessary for the melting of the solder as described later, the solder in the solder layer 105 can be melted in the step of heating. However, the thin adhesive layer 108 present between the solder layer 105 and the land for connecting layers 107 cannot exhibit the function of cleaning the surface sufficiently since the absolute amount of the adhesive layer 108 is small. As the result, the solder at the flat portion at the tip is not melted and excellent soldering cannot be achieved between the solder at the flat portion and the land for connecting layers 107. In contrast, in the solder in portions other than the flat portion (peripheral portions of the solder layer 105), the function of cleaning the surface is sufficiently exhibited since the adhesive layer 108 is present in a sufficient amount. Therefore, the solder is melted and excellent soldering between the melted solder and the land for connecting layers 107 can be achieved. In other words, in the resultant condition, the adhesive layer 108 is present between the solder at the flat portion at the tip and the land for connecting layers 107 and, on the other hand, the land for connecting layers 107 are soldered in the excellent condition in the portions other than the flat portion. Thus, the solder layer 105 and the land for connecting layers 107 are not soldered together in the excellent condition.

In accordance the steps described above, the land for connecting layers 107 and the conductor post 104 are soldered via the solder layer 105 and the multi-layer wiring board 130 in which the layers are bonded together via the adhesive layer 108 can be obtained. In the embodiment shown in FIG. 1(h), a single connecting layer 110 is laminated to the layer to be connected 120. Multi-layer wiring boards having a greater number of layers may be obtained by laminating one or more layers on the multi-layer wiring board 130 shown in FIG. 1(h).

FIG. 2 shows a diagram exhibiting the second embodiment of the process for producing the multi-layer wiring board as the first aspect of the present invention. FIG. 2(h) shows a sectional view exhibiting the structure of the obtained multi-layer wiring board.

The second embodiment of the process for producing a multi-layer wiring board of the present invention is different from the first embodiment in that a wiring pattern 206 is formed in accordance with the electrolytic plating using a metal plate 201 as the lead for electrolysis (the electrode for supplying electricity) in place of forming the wiring pattern 106 by selectively etching the metal foil 101. These embodiments are almost the same with respect to the basic procedures of the production. The second embodiment will be described specifically in the following with respect to procedures different from those in the first embodiment.

A patterned plating resist (not shown in the Figure) is formed on the metal plate 201. After the wiring pattern 206 is formed in accordance with the electrolytic plating using the metal plate 201 as the lead for electrolysis (the electrode for supplying electricity), the plating resist is removed (FIG. 2(a)). By the above electrolytic plating, the wiring pattern 206 is formed on the portions having no plating resist on the metal plate 201. As the material of the wiring pattern 206, copper, nickel, gold, tin, silver or palladium can be used. By using copper, a stable conductor post 104 having a small resistance can be obtained. Although the material of the metal plate 201 is not particularly limited as long as the material is suitable for the process of the present embodiment, it is important that the material has excellent resistance to the chemicals used in the process and can be completely removed by etching before the processing is completed. Examples of the material of the metal plate 206 include copper, copper alloys, the 42 alloy and nickel. As another process, the plating resist may be formed by laminating a dry film resist sensitive to ultraviolet light on the metal plate 201, followed by selectively exposing the laminate to light and developing the exposed laminate.

Figure 2B:
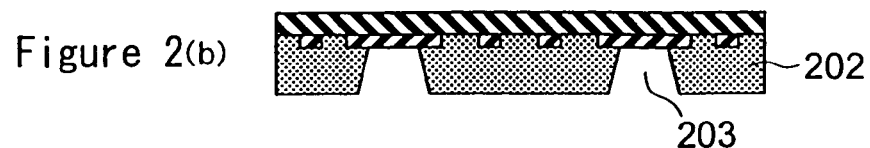
Figure 2C:
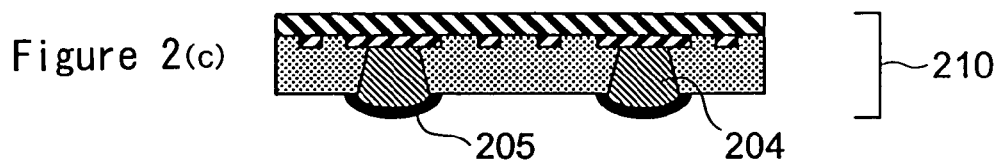

An insulation film 202 is formed on the wiring pattern 206 thus formed and vias 203 are formed on the insulation film 202 (FIG. 2(b)). As the resin constituting the insulation film 202, any resin can be used as long as the resin is suitable for the process of the present embodiment. The process for forming the insulation film 202 is not particularly limited as long as the process is suitable for the used resin. For example, a resin varnish may be directly applied in accordance with the printing, the curtain coating or the bar coating or a resin of the dry film type may be laminated in accordance with the vacuum lamination or the vacuum pressing. In particular, commercial copper foils coated with a resin are easily available. When the copper foil coated with a resin is laminated in accordance with the vacuum lamination in a manner such that the unevenness caused by the wiring pattern 206 on the surface of the wiring pattern is sufficiently filled with the resin layer and the copper foil is dry etched thereafter, the surface of the insulation film 202 can be made very flat without being affected by the unevenness caused by the wiring pattern 206. Since the fine fluctuations on the surface of the copper foil can be transferred to the surface of the insulation film 202, tight adhesion with an adhesive layer 208 shown in FIG. 2(d) can be surely achieved. The process for forming the vias 203 is the same as that in the first embodiment.

Using the metal plate 201 as the lead for electrolysis (the electrode for supplying electricity), conductor posts 204 are formed in accordance with the electrolytic plating. Then, a solder layer 205 is formed on the surface of the tip of the conductor post and a connecting layer 210 is obtained (FIG. 2(c)). The processes for forming the conductor post 204 and the solder layer 205 are the same as those in the first embodiment.

Figure 2D:
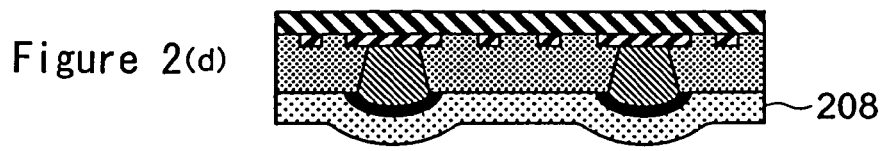

Next, an adhesive layer 208 is formed on the surface of the insulation film 202 (FIG. 2(d)). The process for forming the adhesive layer 208 is the same as that in the first embodiment.

Figure 2E:
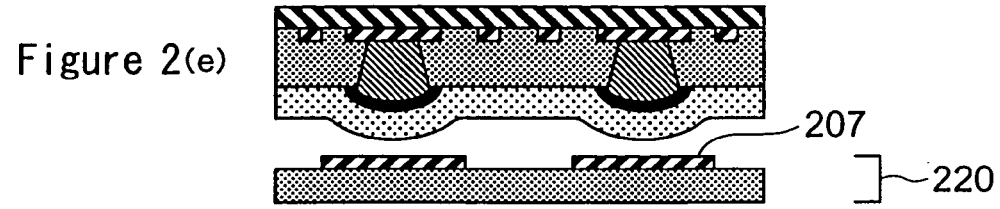

The connecting layer 210 is positioned relative to the layer to be connected 220 (FIG. 2(e)). The process for the positioning is the same as that in the first embodiment.

Figure 2F:
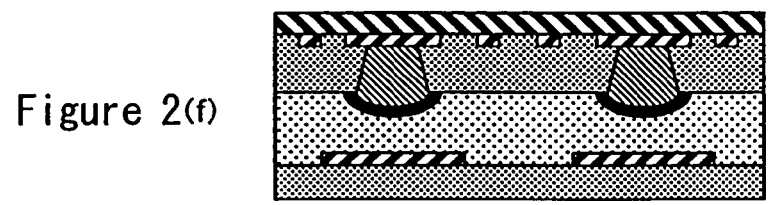
Figure 2G:

The adhesive layer 208 and the layer to be connected 220 are then brought into contact with each other via the adhesive layer 208 (FIG. 2(f)). The process for bringing these layers into contact with each other is the same as that in the first embodiment.

Figure 2H:
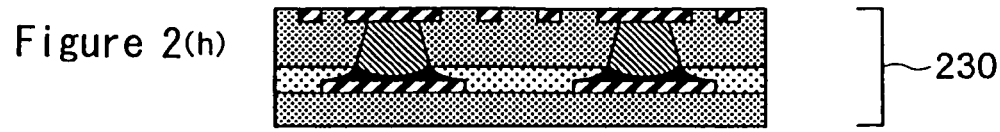

In the last step, the connecting layer 210 and the layer to be connected 220 are bonded together under a pressure and the metal plate 201 is removed by etching (FIG. 2(h)). The process for bonding under a pressure is the same as that in the first embodiment. When the material of the metal plate 201 is different from the material of the wiring pattern 206, the metal plate 201 can be etched using a chemical which does not invade or corrode the wiring pattern 206. When the material of the metal plate 201 is the same as the material of the wiring pattern 206, it is preferable that a layer of a resist metal (not shown in the Figure) resistant to the chemical used for the etching of the metal plate 201 is formed between the metal plate 201 and the wiring pattern 206 in advance since the wiring pattern 206 is invaded and corroded in the etching of the metal plate 201. Invasion and corrosion of the wiring pattern 206 in the etching of the metal plate 201 can be prevented by this procedure due to the presence of the layer of a resist metal. Thereafter, the layer of a resist metal is removed by etching using a chemical which does not invade or corrode the wiring pattern 206. (Of course, the layer of a resist metal may be left remaining without being removed.)

The above procedure will be described more specifically in the following. When the material of the metal plate 201 is copper and the material of the resist metal layer is nickel, tin or a solder, the metal plate 201 can be etched with a commercial ammonia-based etching liquid. When the material of the metal plate 201 is copper and the material of the resist metal is gold, the metal plate 201 can be etched with almost any desired etching liquid including a solution of ferric chloride and a solution of cupric chloride. When the material of the wiring pattern 206 is copper and the material of the resist metal layer is nickel, tin or a solder, the resist metal layer can be etched with a commercial solder-nickel removing agent (for example, PEWTAX manufactured by MITSUBISHI GAS KAGAKU Co., Ltd.). When the material of the wiring pattern 206 is copper and the material of the resist metal layer is gold, it is difficult that the resist metal layer is etched without invasion or corrosion of the wiring pattern 206. In this case, the resist metal layer may be left remaining without being removed.

In accordance with the procedures described above, the land for connecting layers 207 and the conductor post 204 can be soldered via the solder layer 205 and the multi-layer wiring board 230 in which the layers are bonded together via the adhesive layer 208 can be obtained. In the embodiment shown in FIG. 2(h), a single layer of the connecting layer 210 is laminated to the layer to be connected 220. Multi-layer wiring boards having a greater number of layers may be obtained by laminating one or more layers on the multi-layer wiring board 230 shown in FIG. 2(h).

FIG. 3 shows a diagram exhibiting the third embodiment of the process for producing the multi-layer wiring board as the first aspect of the present invention. FIG. 3(h) shows a sectional view exhibiting the structure of the obtained multi-layer wiring board.

The third embodiment of the process for producing the multi-layer wiring board as the first aspect of the present invention is different from the second embodiment in that a conductor post 304 is formed by forming a plating resist of the removable type in place of forming the conductor post 204 by forming the vias 203 in the insulation film 202. These embodiments are almost the same with respect to the basic procedures of the production. The third embodiment will be described specifically in the following with respect to procedures different from those in the second embodiment.

After a wiring pattern 306 is formed on the metal plate 301, a plating resist 302 having openings 303 is formed (FIG. 3)a)). The process for forming the wiring pattern 306 is the same as that in the second embodiment. The process for forming the plating resist 302 is the same as the process for forming the plating resist (not shown in the Figure) used for forming the wiring pattern 206 (as described in the second embodiment).

Conductor posts 304 and solder layers 305 are then formed (FIG. 3(b)). The processes for forming the conductor post 304 and the solder layer 305 are the same as those in the second embodiment.

The plating resist 302 is then removed and a connecting layer 310 is obtained (FIG. 3(c)).

An adhesive layer 308 is formed in a manner such that the adhesive layer 308 covers the solder layer 305 (FIG. 3(d)).

The process for forming the adhesive layer is the same as that in the second embodiment.

The connecting layer 310 is positioned relative to the layer to be connected 320 (FIG. 3(e)). The process for the positioning is the same as that in the second embodiment.

The connecting layer 310 and the layer to be connected 320 are then brought into contact with each other via the adhesive layer 308 (FIG. 3(f)). The process for bringing the layers into contact with each other is the same as that in the second embodiment.

In the last step, the connecting layer 310 and the layer to be connected 320 are bonded together under a pressure and the metal plate 301 is removed by etching (FIG. 3(h)). The processes for the bonding under a pressure and the etching are the same as those in the second embodiment.

In accordance with the above procedures, the multi-layer wiring board in which the land for connecting layers 307 and the conductor posts 304 are soldered with the solder layer 305 and the layers are bonded together with the adhesive layer 308, can be obtained. In the embodiment shown in FIG. 3(h), a single layer of the connecting layer 310 is laminated to the layer to be connected 320. Multi-layer wiring boards having a greater number of layers may be obtained by laminating one or more layers on the multi-layer wiring board 330 shown in FIG. 3(h).

The process for producing a semiconductor device as the second aspect of the present invention will be described in the following with reference to Figures.

The process for producing a semiconductor device as the second aspect of the present invention is a process in which preferably a semiconductor flip chip is mounted on a wiring substrate in accordance with the non-flow underfill process. FIG. 4 shows a diagram exhibiting an embodiment of the present process for producing a semiconductor device and FIG. 4(d) shows a sectional view exhibiting the structure of the obtained semiconductor device.

In the process for producing a semiconductor device of the present invention, a resin layer for the non-flow underfill 403 as the adhesive layer is formed on a wiring substrate 401 having a terminal II for connection to the outside 402 (FIG. 4(a)). Then, a semiconductor element (preferably a semiconductor flip chip) 404, which has solder bumps 406 formed on the surface of the tip of terminals I for connection to the outside 405 disposed on the main face, is attached to the resin layer for the non-flow under fill 403 (FIG. 4(b)).

The resultant combination is heated at a temperature of or higher than the melting point of the solder forming the solder bump 406 and the solder bump 406 is melted. At this time, it is preferable that the solder bump 406 and the terminal II for connection to the outside on the wiring substrate 401 are kept without contacting each other. By using a resin having the function of cleaning the surface for the resin layer for the non-flow underfill 403, oxide films on the surface of the solder bump 406 are reduced and the solder bump 406 is melted. In this manner, after the solder bump 406 is melted, the apex portion of the solder bump 406 and the terminal II for connection to the outside are brought into the point contact with each other under a pressure (FIG. 4(c)). Thereafter, the soldering is achieved by concentric circular spreading of the solder by wetting from the position of the point contact. At this time, it is preferable that the viscosity of the resin layer for the non-flow underfill 403 is 50 Pa·s or smaller. The resin layer for the non-flow underfill 403 is cured by further heating and the semiconductor device 404 and the wiring substrate 401 are bonded together (FIG. 4(d)).

As described above, the highly reliable semiconductor device in which the semiconductor element (preferably the semiconductor flip chip) is mounted on the wiring substrate in accordance with the non-flow underfill process can be obtained.

As the adhesive layer used in the process of the present invention, an adhesive having the function of cleaning the surface and exhibiting a reliable insulation is preferable. The function of cleaning the surface is, for example, the function of removing oxide films present on the surfaces of the solder or the metal to be connected and the function of reducing the oxide films. The wetting between the solder and the surface for the connection is sufficiently enhanced due to the function of cleaning the surface of the adhesive layer. For this purpose, it is important that the adhesive layer contacts the surface to be bonded with the solder so that the surface is cleaned. By cleaning both surfaces, the spreading force of the solder on the surface to be bonded by wetting works and the adhesive layer at the portion to be bonded is eliminated by the spreading force of the solder on the surface by wetting. Therefore, the formation of the residual resin is suppressed and the highly reliable electric connection is achieved by using the adhesive layer for the soldering.

The first preferable adhesive used for the adhesive layer comprises (A) a compound having at least one phenolic hydroxyl group and (B) a resin working as a curing agent of compound (A) as the essential components. The phenolic hydroxyl group in compound (A) having phenolic hydroxyl group removes impurities such as oxides on the surface of the solder and the metal and reduces the oxides due to the function of cleaning the surface and, thus, works as the flux in soldering. Moreover, since an excellent cured product can be obtained due to resin (B) working as the curing agent, removal by washing is not necessary after the soldering, the electric insulation can be kept in an atmosphere of a high temperature and a high humidity, and the highly reliable soldering exhibiting a great strength of bonding can be achieved.

It is preferable that compound (A) having at least one phenolic hydroxyl group which is used for the first preferable adhesive in the present invention is selected from phenol novolak resins, alkylphenol novolak resins, polyfunctional phenol novolak resins, phenol aralkyl resins, resol resins, polyvinylphenol resins, phenolphthalein and dihydroxybenzoic acid. A single compound or a combination of two or more compounds may be selected.

Among the above compounds, polyfunctional phenol novolak resins exhibits remarkably improved properties as the flux for soldering in comparison with monofunctional phenol novolak resins since the polyfunctional phenol novolak resins have two or more phenolic hydroxyl group in one benzene ring.

The phenol novolak resins, the alkylphenol novolak resins and the polyfunctional phenol novolak resins can be obtained by condensation of phenol, alkylphenols and polyfunctional phenols, respectively, with formaldehyde in the presence of an acidic catalyst.

Examples of the alkylphenol used for the alkylphenol novolak include phenol substituted with alkyl groups such as cresol and xylenol and compounds having hydroxyl group bonded to an alkylidene group or a cycloalkylidene group such as 4,4'-isopropylidenediphenol(bisphenol A) and 4,4'-cyclohexylidenediphenol.

Examples of the polyfunctional phenol used for the polyfunctional phenol novolak resin include catechol, resorcinol, hydroquinone, hydroxyhydroquinone and pyrogallol. Among these compounds, catechol and resorcinol are preferable.

The phenol aralkyl resin used in the present invention can be obtained, for example, by the reaction of elimination of methanol between α,α'-dimethoxy-p-xylene and phenol in the presence of an acidic catalyst.

The resol resin used in the present invention can be obtained by the reaction of phenol and formaldehyde in the presence of an alkaline catalyst.

It is preferable that compound (A) having phenolic hydroxyl group which is used in the present invention has a softening point of 30° C. or higher and 150° C. or lower and more preferably 40° C. or higher and 110° C. or lower. A resin having a softening point lower than the above range has a low molecular weight and there is the possibility that the soldering is adversely affected due to loss of the function as the flux by vaporization before or during the soldering and poor bonding by formation of voids. Moreover, there is the possibility that the resin having a low molecular weight cannot provide sufficient physical properties as the cured resin reinforcing the soldered portion. When the softening point of the resin is higher than the above range, fluidity of the adhesive layer during soldering by heating under a pressure decreases and there is the possibility that the soldering becomes poor due to the adverse effects on the contact between the solder and the metal electrode facing the solder and on the spreading of the solder on the surface of the metal by wetting during soldering. When the resin has a softening point in the above range, a sufficient fluidity as the adhesive layer can be obtained at the temperature during the soldering and the stable soldering can be surely achieved.

In the present invention, it is preferable that compound (A) having phenolic hydroxyl group has a weight-average molecular weight of 20,000 or lower, more preferably 10,000 or lower and most preferably 5,000 or lower. When the weight-average molecular weight exceeds 20,000, the fluidity of the adhesive layer during the soldering decreases and there is the possibility that the soldering is adversely affected. The lower limit of the weight-average molecular weight is not particularly limited as long as the softening point is in the range described above and the properties as the adhesive are not adversely affected.

As resin (B) which is used for the first preferable adhesive in the present invention and works as the curing agent for compound (A) having phenolic hydroxyl group, epoxy resins and isocyanate resins are used. Examples of resin (B) include phenol-based resins such as bisphenol-based resins, phenol novolak-based resins, alkylphenol novolak-based resins, biphenol-based resins, naphthol-based resins and resorcinol-based resins; and epoxy compounds and isocyanate compounds which are obtained by modification based on compounds having a skeleton of an aliphatic compound, an alicyclic compound or an unsaturated aliphatic compound.

It is preferable that compound (A) having phenolic hydroxyl group which is used for the first preferable adhesive in the present invention is comprised in the adhesive in an amount of 5% by weight or more and 80% by weight or less and more preferably in an amount of 20% by weight or more and 80% by weight or less. When the amount is less than the above range, there is the possibility that the function of cleaning the surface of the metal decreases and the soldering is not achieved. When the amount exceeds the above range, there is the possibility that a satisfactory cured product is not obtained and the strength of bonding and the reliability deteriorate. It is preferable that resin (B) is used in an amount such that the amount by equivalent of the epoxy group or the isocyanate group per the amount by equivalent of hydroxy group is 0.5 or greater and 1.5 or smaller. However, the amount of resin (B) is not limited to the above range.

The second preferable adhesive used in the present invention comprises (A') an epoxy resin and (B') a compound which has imidazole ring and works as a curing agent of epoxy resin (A') as the essential components. The imidazole ring in compound (B') removes impurities such as oxides on the surfaces of the solder and the metal or reduces the oxide film by the function of cleaning the surface due to the unpaired electrons of the tertiary amine and works as the flux in the soldering. Moreover, the imidazole ring works as the curing agent in the anionic polymerization of epoxy resin (A'). Therefore, an excellent cured product can be obtained and the washing for removal after the soldering is not necessary. The excellent electric insulation can be kept in the atmosphere of a high temperature and a high humidity and highly reliable soldering exhibiting a great strength of bonding can be achieved.

It is preferable that compound (B') used for the second preferable adhesive in the present invention is used in an amount of 1% by weight or more and 10% by weight or less. When the amount of compound (B') is less than the above range, the function of cleaning the surface is weak and there is the possibility that epoxy resin (A') is not sufficiently cured. When the amount of compound (B') exceeds the above range, there is the possibility that the curing reaction proceeds rapidly and the soldering is adversely affected due to a decrease in the fluidity of the adhesive layer during the soldering. Moreover, there is the possibility that the cured product is fragile and a soldered portion having a sufficient strength cannot be obtained. It is more preferable that compound (B') is used in an amount of 1% by weight or more and 5% by weight or less.

Examples of epoxy resin (A') used in combination with compound (B') which is used in the second preferable adhesive in the present invention include phenol-based epoxy resins such as bisphenol-based resins, phenol novolak-based resins, alkylphenol novolak-based resins, biphenol-based resins, naphthol-based resins and resorcinol-based resins; and epoxy compounds which are obtained by modification based on compounds having a skeleton of an aliphatic compound, an alicyclic compound or an unsaturated aliphatic compound.

Examples of compound (B') used in the second preferable adhesive in the present invention include imidazole, 2-methylimidazole, 2-ethyl-4-methylimidazole, 2-phenylimidazole, 1-benzyl-2-methylimidazole, 2-undecylimidazole, 2-phenyl-4-methylimidazole, bis(2-ethyl-4-methylimidazole), 2-phenyl-4-methyl-5-hydroxymthylimidazole, 2-phenyl-4,5-dihydroxymethylimidazole, 1-cyanoethyl-2-ethyl-4-methylimidazole, 1-cyanoethyl-2-methylimidazole, 1-cyanoethyl-2-phenylimidazole and imidazoles of the triazine addition type. Epoxy adducts based on these compounds and microcapsules of these compounds can also be used. The above compound may be used singly or in combination of two or more.

It is preferable that epoxy resin (A') used in the second preferable adhesive in the present invention is used in an amount of 30% by weight or more and 99% by weight or less of the adhesive. When the amount is less than the above range, there is the possibility that a satisfactory cured product is not obtained.

The first preferable adhesive and the second preferable adhesive in the present invention may further comprise (C) a thermoplastic resin, where desired.

Thermoplastic resin (C) contributes to the property for forming a sheet while the adhesive is not cured and to adhesion and flexibility after the adhesive is cured. Examples of thermoplastic resin (C) include phenoxy resins, polyvinyl butyral resins, polyester resins, polyurethane resins, polyimide siloxane resins, polypropylene, styrene-butadiene-styrene copolymers, polyacetal resins, polyamide resins, acrylonitrile-butadiene resins, acrylonitrile-butadiene-methacrylic acid copolymers, acrylonitrile-butadiene-styrene copolymers, polyvinyl acetate resins, nylon, styrene-isoprene copolymers, styrene-butylene-styrene block copolymers, styrene-ethylene-butylene-styrene block copolymers and polymethyl methacrylate resins. Phenoxy resins and polyvinyl butyral resins having excellent properties of the film and excellent fluidity under heating are preferable. Thermoplastic resin (C) may be used singly or in combination of two or more.

It is preferable that thermoplastic resin (C) used in the present invention is used in an amount of 5% by weight or more and 50% by weight or less of the entire adhesive. When the amount is less than the above range, there is the possibility that the property for forming a sheet is poor while the adhesive is not cured and adhesion and flexibility are poor after the adhesive is cured. When the amount exceeds the above range, there is the possibility that the soldering is adversely affected. It is preferable that thermoplastic resin (C) used in the present invention has a glass transition temperature of 40° C. or higher and 150° C. or lower and more preferably 50° C. or higher and 120° C. or lower. When the glass transition temperature is lower than the above range, there is the possibility that the resin has tackiness at the room temperature. When the glass transition temperature exceeds the above range, there is the possibility that sufficient fluidity as the adhesive is not obtained at the temperature for soldering by heating under a pressure and the soldering is adversely affected.

It is preferable that thermoplastic resin (C) used in the present invention has a weight-average molecular weight of 10,000 or greater and 100,000 or smaller and more preferably 12,000 or greater and 70,000 or smaller. When the weight-average molecular weight is smaller than the above range, there is the possibility that the properties for forming a sheet in the uncured condition are poor. When the weight-average molecular weight exceeds the above range, there is the possibility that the soldering is adversely affected.

The adhesive used in the present invention may further comprise (D) a curable antioxidant. The curable antioxidant is a compound which works as the antioxidant and is cured by the reaction with curing agent (B) or curing agent (B'). The curable antioxidant used in the present invention is not particularly limited. Compounds having the benzylidene structure, 3-hydroxy-2-naphthoic acid, pamoic acid, 2,4-dihydroxybenzoic acid and 2,5-dihydroxybenzoic acid are preferable. As the compound having the benzylidene structure, compounds represented by general formula (I) are more preferable:

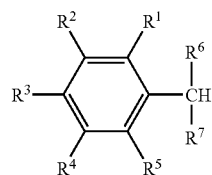

(I)

In the above general formula (I), $R^1$, $R^3$ and $R^5$ each independently represent hydrogen atom, hydroxyl group or carboxyl group, $R^2$ and $R^4$ each independently represent hydrogen atom or an alkyl group, and $R^6$ and $R^7$ each independently represent hydrogen atom, methyl group, hydroxyphenyl group or carboxyphenyl group.

Examples of the compound represented by general formula (I) include ethylidenediphenol, 2,2'-ethylidenebis(4,6-di-t-butylphenol), phenolphthalein and polymers derived from these compounds. The above compound may be used singly or in combination of two or more. Among these compounds, ethylidenediphenol and phenolphthalein are preferable.

In the adhesive in the present invention, it is preferable that curable antioxidant (D) is used in an amount of 0.5% by weight or more and 30% by weight or less and more preferably in an amount of 1% by weight or more and 20% by weight or less of the entire amount of the adhesive. When the amount of the curable antioxidant is less than the above range, there is the possibility that the ability of removing impurities such as oxides on the surface of the solder and the metal deteriorates and the property for soldering is not sufficiently improved. When the amount of the curable antioxidant exceeds the above range, there is the possibility that insulation and reliability deteriorate.

The benzylidene structure contributes to terminating the chain reaction in the oxidation by scavenging radicals formed by oxidation and works effectively as the antioxidant. In the temperature region of the soldering, the benzylidene structure works as the reducing agent by discharging hydrogen radical and removes impurities on the surface of the solder and the metal such as oxides.

The first preferable adhesive in the present invention may comprise a curing catalyst to accelerate the curing. Examples of the curing catalyst include 2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxymethylimidazole, 2-ethyl-4-methylimidazole, 2-undecylimidazole, 1-cyanoethyl-2-methylimidazole, 1-cyanoethyl-2-phenylimidazole, 1-cyanoethyl-2-ethyl-4-methylimidazole, 1-aminoethyl-2-methylimidazole, 1-(cyanoethylaminoethyl)-2-methylimidazole, 1-cyanoethyl-2-phenyl-4,5-bis(cyanoethoxymethylimidazole) and imidazoles of the triazine adduct type. Epoxy adducts based on these compounds and microcapsules of these compounds can also be used. The above compound may be used singly or in combination of two or more.

The adhesive in the present invention may further comprise additives such as silane coupling agents for improving adhesion and resistance to moisture, defoaming agents for preventing formation of voids and liquid or power flame retardants.

The adhesive in the present invention can be obtained by mixing the components described above in desired amounts. The obtained adhesive may be mixed with a solvent and used as the adhesive varnish.

Examples of the solvent used for the adhesive in the present invention include acetone, methyl ethyl ketone, methyl isobutyl ketone, cyclohexanone, toluene, mesitylene, xylene, hexane, isobutanol, n-butanol, 1-methoxy-2-propanol acetate, butylcellosolve, ethylcellosolve, methyl-cellosolve, cellosolve acetate, ethyl lactate, ethyl acetate, dimethyl phthalate, diethyl phthalate, dibutyl phthalate, diethylene glycol, n-butyl benzoate, N-methylpyrrolidone, N,N-dimethylformamide, tetrahydrofuran, γ-butyrolactone and anisole. Solvents having a boiling point of 200° C. or lower are preferable.

It is preferable that the adhesive in the present invention has a melting point of 100° C. or lower. When the adhesive contains a resin having a great molecular weight and has a melting point higher than 100° C., there is the possibility that fluidity of the solder layer decreases during the soldering by heating under a pressure and the soldering is adversely affected.

It is preferable that the adhesive in the present invention has a gel time of 1 minute or longer, more preferably 2 minutes or longer and most preferably 5 minutes or longer at the melting point of the solder. When the gel time at the melting point is shorter than the above range, there is the possibility that the adhesive is cured before the solder and the metal to be connected are bonded together due to the curing reaction proceeding during the soldering and the soldering is adversely affected. When the gel time at the melting point of the solder is 5 minutes or longer, fluidity of the adhesive layer is surely exhibited at the temperature of soldering by heating under a pressure and stable soldering can be achieved. It is preferable that the gel time at the melting point of the solder is 60 minutes or shorter, more preferably 30 minutes or shorter and most preferably 20 minutes or shorter. When the gel time at the melting point of the solder exceeds the above range, there is the possibility that the curing by heating does not proceed sufficiently after the soldering and a sufficient reinforcing effect of the soldered portion is not exhibited although stable soldering is possible. When the curing is conducted at a high temperature so that the curing reaction proceeds sufficiently, there is the possibility that the toughness against fracture of the cured product decreases due to oxidation of the adhesive and impact resistance under heating decreases after the mounting.

It is preferable that, when the solder layer or the solder bump is melted by heating the solder layer or the solder bump at a temperature of or higher than the melting point of the solder and the soldering is conducted under a pressure, the adhesive used in the present invention has a viscosity of 50 Pa·s or smaller at the temperature of the soldering. When the viscosity exceeds 50 Pa·s, there is the possibility that the soldering is not sufficiently achieved since fluidity of the adhesive layer decreases and the contact of the melted solder layer or the melted solder bump with the surface to be bonded is suppressed. Even when the solder is brought into contact with the surface to be connected, a sufficient strength of soldering cannot be obtained since the adhesive cannot be eliminated by the spreading force of the solder on the surface to be bonded by wetting. To surely achieve the soldering, it is preferable that the viscosity of the adhesive is more preferably 10 Pa·s or smaller and most preferably 1 Pa·s or smaller.

The present invention also provides the electronic parts which are, specifically, the multi-layer wiring board and the semiconductor device, obtained in accordance with the processes described above.

The present invention will be described more specifically with reference to embodiments in the following. However, the present invention is not limited to the examples.

EXAMPLE 1 AND COMPARATIVE EXAMPLE 1

(1) Preparation of Adhesive Varnish 1

Into 104 g of methyl ethyl ketone, 106 g of a cresol novolak resin [manufactured by SUMITOMO DUREZ Co., Ltd.; PR-HF-3; the hydroxyl equivalent: 106], 35 g of an epoxy resin of the diallylbisphenol A type [manufactured by NIPPON KAYAKU Co., Ltd.; RE-810NM; the epoxy equivalent: 225] and 210 g an epoxy resin of the dicyclopentadiene type [manufactured by NIPPON KAYAKU Co., LTD.; XD-1000L; the epoxy equivalent: 248] were dissolved and adhesive varnish 1 for metal bonding was prepared.

(2) Preparation of a Multi-Layer Wiring Board

In an insulation film of a polyimide resin on a flexible substrate for printed wiring [manufactured by SUMITOMO BAKELITE Co., Ltd.; A1FLEC] composed of a copper foil (the metal foil 101; the thickness: 18 µm) and an insulation film of a polyimide resin (the insulation film 102; the thickness: 25 µm), 300 vias (the via 103) each having a diameter of 45 µm at the top and a diameter of 25 µm at the bottom were formed using the UV-YAG laser. After the inside and peripheral portions of the vias were cleaned with an etching liquid for a resin containing permanganic acid, the vias were filled with copper by the electrolytic plating using the copper foil at the back face as the lead for the electrolytic plating (the electrode for supplying electricity) and copper posts (the conductor posts 104) were formed. The time of the electrolytic plating with copper was adjusted so that the diameter of the copper post was made 45 µm. On the surface of the formed copper post, a solder layer of Sn—Pb cocrystals (the solder layer 105) having a thickness of 4 µm was formed in accordance with the electrolytic plating. The height of protrusion of the surface of the tip of the solder layer from the surface of the insulation film was 10 µm. Then, a wiring pattern (the wiring pattern 106) was formed by selective etching of the copper foil. A connecting layer (the connecting layer 110) was obtained in accordance with the procedures described above.

Adhesive varnish 1 obtained in (1) described above was applied to the obtained connecting layer in accordance with the bar coating so that the surface of the insulation film, i.e., the surface on which the solder layer of Sn—Pb cocrystals has been formed, was coated with the adhesive varnish. After the coating film was dried at 80° C. for 20 minutes, an adhesive layer (the adhesive layer 108) having a thickness of 20 µm was formed.

Separately, using a glass epoxy laminate coated with copper films on both faces [manufactured by SUMITOMO BAKELITE Co., Ltd.; ELC] which had copper foils having a thickness of 12 µm on both faces and corresponded to FR-5, a wiring pattern (not shown in the Figure) and a land for connecting layers (the land for connecting layers 107) were formed by selectively etching the copper foil and a layer to be connected (the layer to be connected 120) was obtained. The diameter of the land for connecting layers was adjusted at 300 µm taking the error allowable in positioning into consideration.

Positioning marks formed in advance in the connecting layer and the layer to be connected obtained in accordance with the above procedures were read by an apparatus for recognizing images and the layers were positioned relative to each other and temporarily attached under a pressure at a temperature of 100° C. The section of the temporarily attached sample was observed and it was found that the solder layer and the land for connecting layers did not contact each other and a gap (the adhesive layer) of about 5 µm was present.

Figure 5:
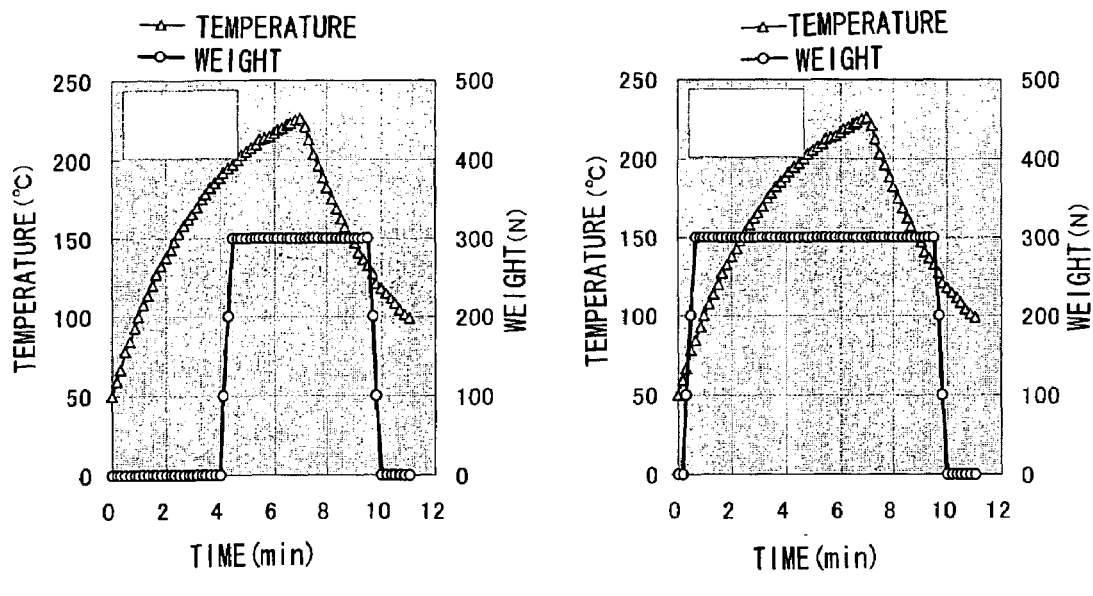
FIG. 5 shows a diagram exhibiting the condition of heating under a pressure in Example 1 and Comparative Example 1.

The temporarily attached sample was permanently bonded under two conditions (condition 1 and condition 2) shown in FIG. 5.

Condition 1: heating at a temperature of or higher than the melting point of the solder (183° C.) and applying a pressure thereafter (Example 1)

Condition 2: heating at a temperature of or lower than melting point of the solder and applying a pressure thereafter To observe the soldered portion of the obtained sample, the connecting layer and the layer to be connected were cleaved at the interface of the layers, i.e., at the adhesive layer, and the wetting of the land for connecting layers with the solder was examined. Pictures of the surfaces after the lands for connecting layers of the samples permanently bonded under a pressure in condition 1 and in condition 2 were cleaved are shown in FIG. 6.

Figure 6:
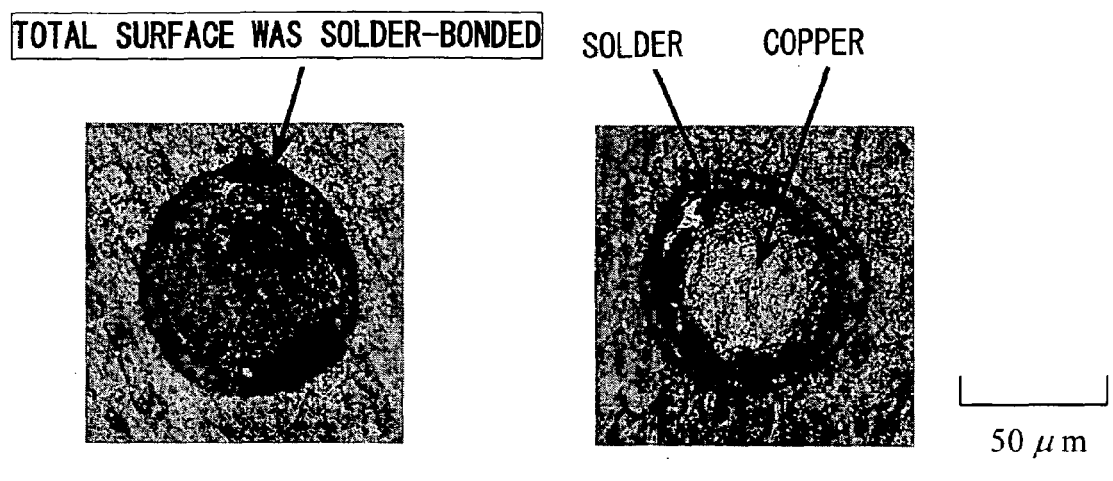
FIG. 6 shows pictures exhibiting the condition of soldering in Example 1 and Comparative Example 1.

It is shown in FIG. 6 that the solder layer spread widely by wetting the land for connecting layers in the sample permanently bonded under a pressure in condition 1 (Example 1). In contrast, in the sample permanently bonded under a pressure in condition 2 (Comparative Example 1), a portion around the center was not soldered and copper of the land for connecting layers was exposed (the adhesive layer was present between the layers). Thus, it is clearly shown that the process comprising applying a pressure after heating at a temperature of or higher than the melting point of the solder is effective.

EXAMPLE 2

(1) Preparation of Adhesive Varnish 2

Into 165 g of methyl ethyl ketone, 106 g of a cresol novolak resin [manufactured by SUMITOMO DUREZ Co., Ltd.; PR-HF-3], 105 g of phenolphthalein [manufactured by TOKYO KASEI Co., Ltd.] and 450 g of an epoxy resin of the diallylbisphenol A type [manufactured by NIPPON KAYAKU Co., Ltd.; RE-810NM] were dissolved and adhesive varnish 2 for metal bonding was prepared.

(2) Preparation of a Multi-Layer Wiring Board

In an insulation film of a polyimide resin on a flexible substrate for printed wiring (manufactured by SUMITOMO BAKELITE Co., Ltd.; A1FLEC) composed of a copper foil (the metal foil 101; the thickness: 18 µm) and an insulation film of a polyimide resin (the insulation film 102; the thickness: 25 µm), 300 vias (the via 103) each having a diameter of 45 µm at the top and a diameter of 25 µm at the bottom were formed using the UV-YAG laser. After the inside and peripheral portions of the vias were cleaned with an etching liquid for a resin containing permanganic acid, the vias were filled with copper by the electrolytic plating using the copper foil at the back face as the lead for electrolytic plating (the electrode for supplying electricity) and copper posts (the conductor posts 104) were formed. The time of the electrolytic plating with copper was adjusted so that the diameter of the copper post was made 45 µm. On the surface of the formed copper post, a solder layer of Sn—Pb cocrystals (the solder layer 105) having a thickness of 4 μm was formed in accordance with the electrolytic plating. The height of protrusion of the surface of the tip of the solder layer from the surface of the insulation film was 10 μm. Then, a wiring pattern (the wiring pattern 106) was formed by selective etching of the copper foil. A connecting layer (the connecting layer 110) was obtained in accordance with the procedures described above.

Adhesive varnish 2 obtained in (1) described above was applied to the obtained connecting layer in accordance with the bar coating so that the surface of the insulation film, i.e., the surface on which the solder layer of Sn—Pb cocrystals has been formed, was coated with the adhesive varnish. After the coating film was dried at 80° C. for 20 minutes, an adhesive layer (the adhesive layer 108) having a thickness of 20 μm was formed.

Separately, using a glass epoxy laminate coated with copper films on both faces [manufactured by SUMITOMO BAKELITE Co., Ltd.; ELC] which had copper foils having a thickness of 12 μm on both faces and corresponded to FR-5, a wiring pattern (not shown in the Figure) and a land for connecting layers (the land for connecting layers 107) were formed by the selective electrolytic plating with gold and a layer to be connected (the layer to be connected 120) was obtained. The diameter of the land for connecting layers was adjusted at 300 μm taking the error allowable in positioning into consideration.

Positioning marks formed in advance in the connecting layer and the layer to be connected obtained in accordance with the above procedures were read by an apparatus for recognizing images and the layers were positioned relative to each other and temporarily attached under a pressure at a temperature of 100° C. so that the surfaces of the connecting layer and the faced layer to be connected contact each other. The section of the temporarily attached sample was observed and it was found that the solder layer and the land for connecting layers did not contact each other and a gap (the adhesive layer) of about 30 μm was present.

After the temporarily attached sample was heated at a temperature of or higher than the melting point of the solder (183° C.), a pressure was applied (condition 3) and a multi-layer wiring plate was obtained. The profiles of the temperature and the pressure in the above procedure are shown in FIG. 7.

<Observation of the solder Layer in the Heating Step>

In the present example, when the temporarily attached sample was permanently bonded in condition 3, the sample was taken out without pressing after the sample was heated at a temperature of or higher than the melting point of the solder (183° C.) and the connecting layer and the layer to be connected were cleaved from each other at the interface of the layers, i.e., the adhesive layer. It was examined whether the solder layer immediately before the bonding was formed into a shape of a dome due to the function of the adhesive layer to clean the surface of the metal. It was found that the shape of a dome was formed and the surface had a smoothly curved shane without roughness.

Separately, another multi-layer wiring board was obtained in accordance with the same procedures as those described above except that adhesive varnish 2 used above was replaced with adhesive varnish 3 which was prepared by dissolving 200 g of an epoxy resin of the diallylbisphenol A type [manufactured by NIPPON KAYAKU Co., Ltd.; RE-810NM] and 200 g of an epoxy resin of the cresol novolak type [manufactured by NIPPON KAYAKU Co., Ltd.; EOCN-1020-65] into 100 g of methyl ethyl ketone, followed by adding 0.1 g of 2-phenyl-4,5-dihydroxymethylimidazole [manufactured by SHIKOKU KASEI KOGYO Co., Ltd.; 2PHZ-PW].

Using the obtained multi-layer wiring board, the solder layer in the heating step was observed. Almost no change in the shape of the solder layer was found and no shape of a dome was observed.

When adhesive varnish 3 having no function of cleaning the surface was used for the adhesive layer, the oxide film on the surface of the solder layer was not sufficiently cleaned in the heating step in condition 3 and the condition of the surface was almost the same as that of the solder layer formed by the electrolytic plating. In contrast, when adhesive varnish 2 having the function of cleaning the surface was used for the adhesive layer, the solder layer was deformed and the most stable shape of a dome was formed when the solder layer melted since the oxide film on the surface of the solder layer was sufficiently cleaned in the heating step in condition 3. It was also confirmed by the observation of the section that the bonding was achieved without the presence of the adhesive layer between the layers. Therefore, it is suggested that, in the step of pressing, the solder layer formed into the shape of a dome contacted the face to be connected at the apex portion and the solder spread on the surface in the concentric circular shape by wetting from the point of the contact while the adhesive was eliminated.

<Measurement of Strength of Bonding at the Soldered Portion>

When the wiring pattern at the side of the connecting layer of the multi-layer wiring board obtained after the permanent bonding under a pressure was etched to the thickness of the circuit and then the connecting layer and the layer to be connected were cleaved at the interface of the layers, i.e., at the adhesive layer, the conductor posts and the insulation layer were cleaved from the connecting layer at the interface and the conductor posts remained on the layer to be connected. The conductor posts soldered to the land for connecting layers of the layer to be connected were arranged in a shape transferred from the arrangement on the connecting layer. The shear strength of the conductor posts on the layer to be connected was measured using a universal bond tester [manufactured by DEIZI Company; 2400PC]. The average shear strength per one bump was 402 mN when adhesive varnish 2 was used and 206 mN when adhesive 3 was used.

<Observation of the Section of the Connected Portion of the Metal>

A section of the portion bonded with the metal (the soldered portion) of the multi-layer wiring board obtained above was observed by an electron microscope (SEM) and the condition of the bonding was examined. The condition of bonding of the metal was excellent when adhesive varnish 2 was used, but partial bonding was found when adhesive varnish 3 was used.

COMPARATIVE EXAMPLE 2

The same procedures as those conducted in Example 2 were conducted in steps to the temporary attachment. The obtained temporarily attached sample was heated while the sample was approximately simultaneously pressed. The heating under a pressure was continued to achieve the permanent bonding (condition 4) and a multi-layer wiring board was obtained. The profiles of the temperature and the pressure are shown in FIG. 7.

The strength of bonding of the soldered portion was measured in accordance with the same method as that in Example 2 and the average shear strength per 1 bump was found to be 275 mN. A section of the bonded portion of the metal was observed in accordance with the same method as that in Example 2 and partial bonding was found.

The shear strength of the conductor post per one bump was 275 mN in Comparative Example 2 and, in contrast, 402 mN in Example 2. The value in Example 2 was about 1.5 times as great as the value in Comparative Example 2. The importance of the step in which the pressure is applied after the solder layer obtained by the step of temporary connection is heated at a temperature of or higher than the melting point of the solder so that the solder is melted and the convex shape (the shape of a dome) is formed, is clearly shown. This is clearly shown also by the results of the observation of the sections.

INDUSTRIAL APPLICABILITY

In accordance with the present invention, the connection between layers is surely achieved by simultaneously conducting the electric connection and the bonding between layers and a highly reliable multi-layer wiring board can be produced with a great productivity. A semiconductor flip chip can be mounted effectively to the wiring substrate in accordance with the non-flow underfill process and a highly reliable semiconductor device can be produced with a great productivity.

The invention claimed is:

1. A process for producing an electronic part which comprises soldering an electronic member (A) having conductor portions I for electric connection having a solder layer or a solder bump on a surface of a tip and an electronic member (B) to be connected having conductor portions II for electric connection arranged at positions corresponding to positions of conductor portions I for electric connection by pressing electronic member (A) to electronic member (B) under heating via an adhesive layer, the process comprising:
bringing at least the solder layer or the solder bump into contact with the adhesive layer,
melting the solder layer or the solder bump by heating at a temperature of or higher than a melting point of a solder forming the solder layer or the solder bump,
conducting the soldering by pressing the melted solder layer or the solder bump only after said solder layer or said solder bump are melted, and
curing the adhesive layer.

2. A process for producing an electronic part according to claim 1, wherein the electronic part is a multi-layer wiring board, electronic member (A) is a connecting layer which has a wiring pattern, conductor posts formed on the wiring pattern and solder layers formed on a surface of a tip of the conductor posts, and electronic member (B) is a layer to be connected which has lands for connecting layers used for connection with the conductor posts.

3. A process for producing an electronic part according to claim 2, wherein the conductor post comprises copper formed by electric plating.

4. A process for producing an electronic part according to claim 3, wherein the solder layer is formed by electric plating.

5. A process for producing an electronic part according to claim 1, wherein the melted solder layer has a convex shape.

6. A process for producing an electronic part according to claim 1, wherein the electronic part is a semiconductor device, electronic member (A) is a semiconductor element which has terminals I for connection with outside disposed on a main face and solder bumps formed on a tip of a surface of terminals I, and electronic member (B) is a wiring board which has on a surface terminals II for connection with outside arranged at positions corresponding to positions of terminals I.

7. A process for producing an electronic part according to claim 5, wherein the adhesive layer has a thickness greater than a height of the solder layer or the solder bump melted by heating.

8. A process for producing an electronic part according to claim 1, wherein the solder layers or the solder bump is melted at an inside of the adhesive layer softened by heating at a temperature of or higher than the melting point of the solder.

9. A process for producing an electronic part according to claim 8, wherein the solder layer or the solder bump which is melted and has a convex shape and conductor portion II for electric connection are kept without contacting each other.

10. A process for producing an electronic part according to claim 8, wherein the solder layer or the solder bump which is melted and has a convex shape is soldered to conductor portion II for electric connection in a manner such that the solder spreads under a pressure from an apex portion of a solder layer or a solder bump in a melted condition by wetting a surface of conductor portion II for electric connection.

11. A process for producing an electronic part according claim 1, wherein an adhesive used for the adhesive layer has a function of cleaning a surface of soldering and cleans a surface of the solder layer or the solder bump while being heated.

12. A process for producing an electronic part according to claim 11, wherein, when the solder layer or the solder bump is melted by heating at a temperature of or higher than a melting temperature of the solder forming the solder layer or the solder bump and the soldering is conducted by pressing the melted solder layer or solder bump, the adhesive used for the adhesive layer has a viscosity of 50 Pa·s or smaller at a temperature of the soldering.

13. A process for producing an electronic part according to of claim 11, wherein the adhesive used for the adhesive layer comprises (A) a compound having at least one phenolic hydroxyl group and (B) a resin working as a curing agent of compound (A) as essential components.

14. A process for producing an electronic part according to claim 13, wherein compound (A) having at least one phenolic hydroxyl group is a compound selected from a group consisting of phenol novolak resins, alkylphenol novolak resins, polyfunctional phenol novolak resins, phenol aralkyl resins, resol resins, polyvinyiphenol resins, phenolphthalein and dihydroxybenzoic acid.

15. A process for producing an electronic part according to claim 13, wherein the adhesive used for the adhesive layer comprises compound (A) having at least one phenolic hydroxyl group in an amount in a range of 5% or more and 80% or less.

16. A process for producing an electronic part according to claim 11, wherein the adhesive used for the adhesive layer comprises (A') an epoxy resin and (B') a compound which has imidazole ring and works as a curing agent of epoxy resin (A') as essential components.

17. A process for producing an electronic part according to claim 16, wherein the adhesive used for the adhesive layer comprises compound (B') working as a curing agent in an amount in a range of 1% by weight to 10% by weight.

18. An electronic part obtained in accordance with a process described in claim 1.

19. A process for producing an electronic part according to claim 2, wherein the melted solder layer has a convex shape.

20. A process for producing an electronic part according to claim 4, wherein the melted solder layer has a convex shape.

21. A process for producing an electronic part according to claim 19, wherein the adhesive layer has a thickness greater than a height of the solder layer or the solder bump melted by heating.

22. A process for producing an electronic part according to claim 20, wherein the adhesive layer has a thickness greater than a height of the solder layer or the solder bump melted by heating.

23. A process for producing an electronic part according to claim 2, wherein the solder layers or the solder bump is melted at an inside of the adhesive layer softened by heating at a temperature of or higher than the melting point of the solder.

24. A process for producing an electronic part according to claim 6, wherein the solder layers or the solder bump is melted at an inside of the adhesive layer softened by heating at a temperature of or higher than the melting point of the solder.

25. A process for producing an electronic part according to claim 22, wherein the solder layers or the solder bump is melted at an inside of the adhesive layer softened by heating at a temperature of or higher than the melting point of the solder.

26. A process for producing an electronic part according to claim 23, wherein the solder layer or the solder bump which is melted and has a convex shape and conductor portion II for electric connection are kept without contacting each other.

27. A process for producing an electronic part according to claim 24, wherein the solder layer or the solder bump which is melted and has a convex shape and conductor portion II for electric connection are kept without contacting each other.

28. A process for producing an electronic part according to claim 25, wherein the solder layer or the solder bump which is melted and has a convex shape and conductor portion II for electric connection are kept without contacting each other.

29. A process for producing an electronic part according to claim 23, wherein the solder layer or the solder bump which is melted and has a convex shape is soldered to conductor portion II for electric connection in a manner such that the solder spreads under a pressure from an apex portion of a solder layer or a solder bump in a melted condition by wetting a surface of conductor portion II for electric connection.

30. A process for producing an electronic part according to claim 24, wherein the solder layer or the solder bump which is melted and has a convex shape is soldered to conductor portion II for electric connection in a manner such that the solder spreads under a pressure from an apex portion of a solder layer or a solder bump in a melted condition by wetting a surface of conductor portion II for electric connection.

31. A process for producing an electronic part according to claim 28, wherein the solder layer or the solder bump which is melted and has a convex shape is soldered to conductor portion II for electric connection in a manner such that the solder spreads under a pressure from an apex portion of a solder layer or a solder bump in a melted condition by wetting a surface of conductor portion II for electric connection.

32. A process for producing an electronic part according to claim 2, wherein an adhesive used for the adhesive layer has a function of cleaning a surface of soldering and cleans a surface of the solder layer or the solder bump while being heated.

33. A process for producing an electronic part according to claim 6, wherein an adhesive used for the adhesive layer has a function of cleaning a surface of soldering and cleans a surface of the solder layer or the solder bump while being heated.

34. A process for producing an electronic part according to claim 25, wherein an adhesive used for the adhesive layer has a function of cleaning a surface of soldering and cleans a surface of the solder layer or the solder bump while being heated.

35. A process for producing an electronic part according to claim 32, wherein, when the solder layer or the solder bump is melted by heating at a temperature of or higher than a melting temperature of the solder fonning the solder layer or the solder bump and the soldering is conducted by pressing the melted solder layer or solder bump, the adhesive used for the adhesive layer has a viscosity of 50 Pa·s or smaller at a temperature of the soldering.

36. A process for producing an electronic part according to claim 32, wherein the adhesive used for the adhesive layer comprises (A) a compound having at least one phenolic hydroxyl group and (B) a resin working as a curing agent of compound (A) as essential components.

37. A process for producing an electronic part according to claim 33, wherein the adhesive used for the adhesive layer comprises (A) a compound having at least one phenolic hydroxyl group and (B) a resin working as a curing agent of compound (A) as essential components.

38. A process for producing an electronic part according to claim 36, wherein compound (A) having at least one phenolic hydroxyl group is a compound selected from a group consisting of phenol novolak resins, alkylphenol novolak resins, polyfunctional phenol novolak resins, phenol aralkyl resins, resol resins, polyvinylphenol resins, phenolphthalein and dihydroxybenzoic acid.

39. A process for producing an electronic part according to claim 37, wherein compound (A) having at least one phenolic hydroxyl group is a compound selected from a group consisting of phenol novolak resins, alkylphenol novolak resins, polyfunctional phenol novolak resins, phenol aralkyl resins, resol resins, polyvinylphenol resins, phenolphthalein and dihydroxybenzoic acid.

40. A process for producing an electronic part according to claim 36, wherein the adhesive used for the adhesive layer comprises compound (A) having at least one phenolic hydroxyl group in an amount in a range of 5% or more and 80% or less.

41. A process for producing an electronic part according to claim 37, wherein the adhesive used for the adhesive layer comprises compound (A) having at least one phenolic hydroxyl group in an amount in a range of 5% or more and 80% or less.

42. A process for producing an electronic part according to claim 32, wherein the adhesive used for the adhesive layer comprises (A') an epoxy resin and (B') a compound which has imidazole ring and works as a curing agent of epoxy resin (A') as essential components.

43. A process for producing an electronic part according to claim 33, wherein the adhesive used for the adhesive layer comprises (A') an epoxy resin and (B') a compound which has imidazole ring and works as a curing agent of epoxy resin (A') as essential components.

44. A process for producing an electronic part according to claim 42, wherein the adhesive used for the adhesive layer comprises compound (B') working as a curing agent in an amount in a range of 1% by weight or more and 10% by weight or less.

45. A process for producing an electronic part according to claim 43, wherein the adhesive used for the adhesive layer comprises compound (B') working as a curing agent in an amount in a range of 1% by weight or more and 10% by weight or less.

* * * * *